(12) United States Patent
Yamamoto

(10) Patent No.: US 6,262,590 B1
(45) Date of Patent: Jul. 17, 2001

(54) SUPPLY VOLTAGE ABNORMAL CONDITION INDICATING DEVICE

(75) Inventor: Kazuhiko Yamamoto, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 09/122,548

(22) Filed: Jul. 24, 1998

(30) Foreign Application Priority Data

Jul. 30, 1997 (JP) .................................................... 9-006654

(51) Int. Cl.[7] .................................................. G01R 31/36
(52) U.S. Cl. ........................................................... 324/771
(58) Field of Search .................................. 324/107, 141, 324/142, 510, 426, 522, 771; 345/38, 39, 52

(56) References Cited

U.S. PATENT DOCUMENTS

| | | | |
|---|---|---|---|
| 4,149,149 | * | 4/1979 | Miki et al. ............................... 345/38 |
| 4,276,605 | * | 6/1981 | Okamoto et al. ..................... 700/294 |
| 4,296,375 | * | 10/1981 | Takezaki ........................... 324/103 P |

* cited by examiner

Primary Examiner—Ernest Karlsen
Assistant Examiner—Minh Tang
(74) Attorney, Agent, or Firm—Lackenbach Siegel Marzullo Aronson & Greenspan

(57) ABSTRACT

A multi-system power supply circuit for providing power supplies different in system, has signal generating circuits which correspond to the power supplies different in system, and generates repetitive frequency signals corresponding to the number of power supply systems, or indicating voltage generating circuits which correspond to the power supplies different in system, and generates voltages corresponding to the number of power supply systems. When any one of the power supplies becomes abnormal, the repetitive signal supplied to the detection indicating circuit from the repetitive frequency signal generating circuit corresponding to that power supply is turned on and off, or the indicating voltage generating circuit applies the indicating voltage to the detection indicating circuit, so that it can be detected with ease which of the power supply systems is abnormal. Also in the case where the supply circuit of a plurality of power supply systems become abnormal, the repetitive frequencies which are indicated with a predetermined time interval, or the magnitudes of the voltages which are indicated are utilized to detect which systems are abnormal. Hence, the power supply circuit can be repaired or inspected with high efficiency.

3 Claims, 4 Drawing Sheets

SUPPLY VOLTAGE ABNORMAL CONDITION INDICATING DEVICE

BACKGROUND OF THE INVENTION

1. Field of the Invention

This invention relates to a supply voltage abnormal condition indicating device adapted to indicate that a power supply or supplies are abnormal.

2. Description of the Related Art

A multi-system power supply circuit providing a plurality of power supplies different in power system is known in the art.

Heretofore, in order to determine whether or not any one of the power supplies of the multi-system power supply circuit is abnormal, it is tested with a voltage tester or the like. This conventional technique is disadvantageous in the following point: For instance in the case where a television set is repaired, it is necessary to measure each of the output voltages of the multi-system power supply circuit with a volt meter. This is low in work efficiency. That is, it takes much time and labor to repair the television set.

SUMMARY OF THE INVENTION

In view of the foregoing, an object of the invention is to provide a supply voltage abnormal condition indicating device which indicates any one of power supplies of a multi-system power supply circuit which is out of order or in abnormal condition in an electronic device such as a television set.

In order to achieve the above object, the invention provides a supply voltage abnormal condition indicating device comprising: a multi-system power supply circuit which provides power supplies different in power system; signal generating circuits which correspond to the power systems of the power supply circuit, and generate signals of repetitive frequencies corresponding to the number of the power systems of the power supply circuit; a detection indicating circuit to which output signals of the signal generating circuits are supplied; and control circuits which are connected to the power system of the power supply circuit respectively, and perform control so that, when a certain power system of the power supply circuit becomes abnormal in output voltage, a signal of a repetitive frequency corresponding to the certain power system is supplied to the detection indicating circuit from the signal generating circuit, wherein the detection indicating circuit indicates that the certain power system is abnormal.

Further, the invention provides a supply voltage abnormal condition indicating device comprising: a multi-system power supply circuit which provides power supplies different in power system; signal generating circuits which correspond to the power systems of the power supply circuit, and generate signals of repetitive frequencies corresponding to the number of the power systems of the power supply circuit; a detection indicating circuit to which output signals of the signal generating circuits are supplied; control circuits which are connected to the power system of the power supply circuit respectively, and perform control so that, when a certain power system of the power supply circuit becomes abnormal in output voltage, a signal of a repetitive frequency corresponding to the certain power system is supplied to the detection indicating circuit from the signal generating circuit; and a time sequential switching control circuit which starts its operation when a plurality of power systems of the power supply circuit become abnormal, and performs control so that signals of repetitive frequencies corresponding to the plurality of power systems are supplied sequentially with time shift from the signal generating circuits to the detection indicating circuit, wherein the detection indicating circuit indicates that the plurality of power systems are abnormal.

Further, the invention provides a supply voltage abnormal condition indicating device comprising: a multi-system power supply circuit which provides power supplies different in power system; indicating voltage generating circuits which correspond to the power systems of the power supply circuit, and generates voltage corresponding to the number of the power systems of the power supply circuit; a detection indicating circuit to which output signals of the indicating voltage generating circuits are supplied; and control circuits which are connected to the power system of the power supply circuit respectively, and perform control so that, when a certain power system of the power supply circuit becomes abnormal in output voltage, a voltage corresponding to the certain power system is supplied to the detection indicating circuit from the indicating voltage generating circuit, wherein the detection indicating circuit indicates that the certain power system is abnormal.

Further, the invention provides a supply voltage abnormal condition indicating device comprising: a multi-system power supply circuit which provides power supplies different in power system; indicating voltage generating circuits which correspond to the power systems of the power supply circuit, and generates voltage corresponding to the number of the power systems of the power supply circuit; a detection indicating circuit to which output signals of the indicating voltage generating circuits are supplied; control circuits which are connected to the power system of the power supply circuit respectively, and perform control so that, when a certain power system of the power supply circuit becomes abnormal in output voltage, a voltage corresponding to the certain power system is supplied to the detection indicating circuit from the indicating voltage generating circuit; and a time sequential switching control circuit which starts its operation when a plurality of power systems of the power supply circuit become abnormal, and performs control so that voltages corresponding to the plurality of power systems are supplied sequentially with time shift from the indicating voltage generating circuit to the detection indicating circuit, wherein the detection indicating circuit indicates that the plurality of power systems are abnormal.

DETAILED DESCRIPTION OF THE PREFERRED EMBODIMENTS

Preferred embodiments of the invention will be described with reference to the accompanying drawings.

First Embodiment

Figure 1:
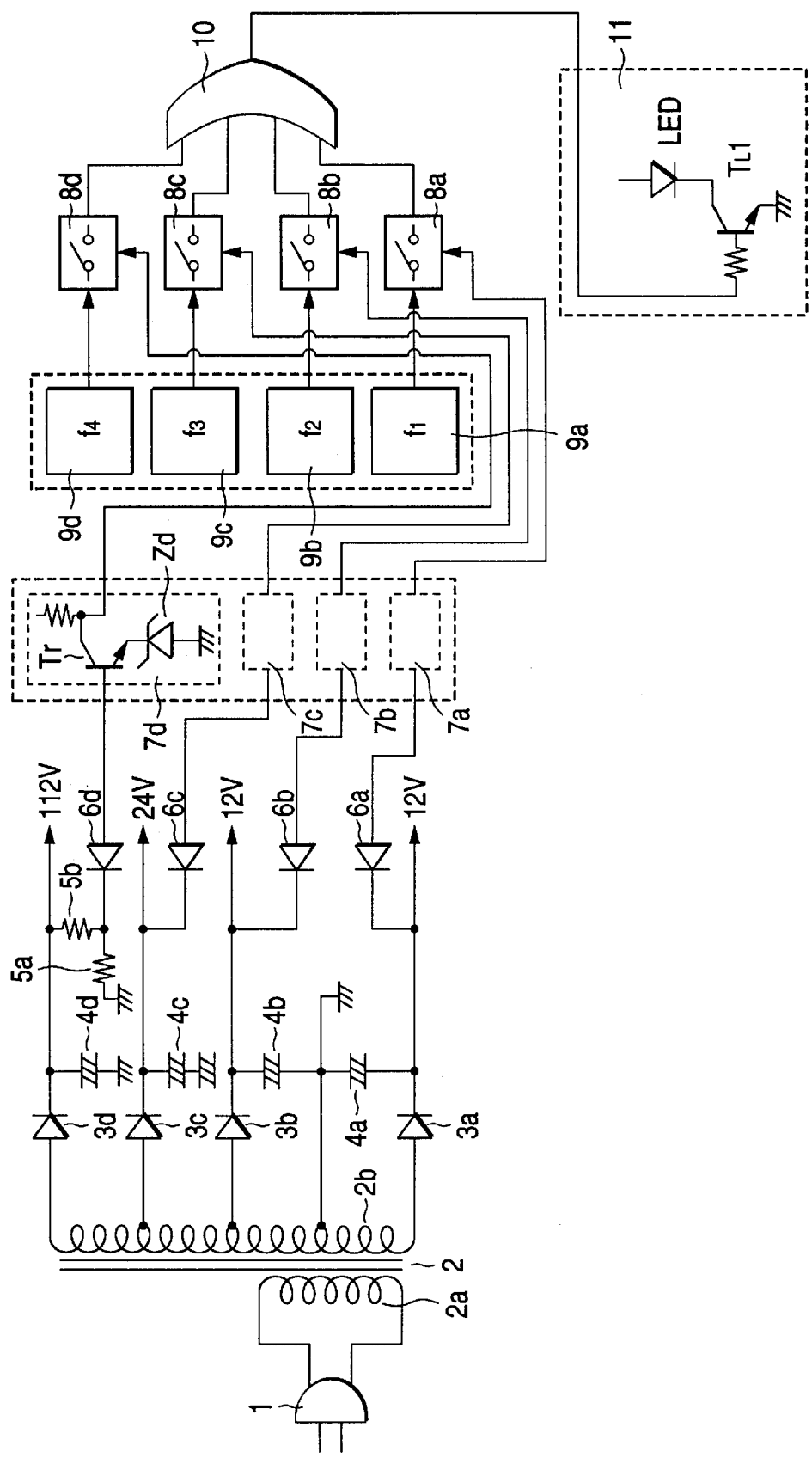
FIG. 1 is a circuit diagram, partly as a block diagram, showing an example of a supply voltage abnormal condition indicating device, which constitutes a first embodiment of the invention.

An example of a supply voltage abnormal condition indicating device, which is a first embodiment of the invention, is as shown in FIG. 1.

In FIG. 1, reference numeral 1 designates a power plug of a television set which is connected to a primary side 2a of a power transformer 2, a secondary side 2b of which is connected to power rectifiers 3a, 3b, 3c and 3d. The output sides of the rectifiers 3a through 3d are connected to smoothing capacitors 4a, 4b, 4c and 4d, respectively. The output sides of the rectifiers 3a, 3b, 3c and 3d provide DC voltages 12 V, 12 V, 24 V and 112 V, respectively. The DC voltage 112 V is voltage-divided by voltage dividing resistors 5a (R1) and 5b (R2); that is, R1/(R1+R2) is carried out.

The respective voltages are applied through unidirectional protective diodes 6a, 6b, 6c and 6d to control circuits 7a, 7b, 7c and 7d, respectively. The control circuits 7a through 7d include a comparison circuit made up of a Zener diode Zd. Under the steady state that a voltage not lower than a predetermined reference voltage is applied to the base of a transistor Tr, the transistor Tr is rendered conductive, and first switching circuits 8a, 8b, 8c and 8d are turned off. Therefore, the output signals of signal generating circuits 9a, 9b, 9c and 9d in which different repetitive frequencies f1, f2, f3 and f4 (for instance, 1Hz, 2Hz, 3Hz and 4Hz) are in correspondence to the supply voltages 12 V, 12 V, 24 V and 112 V, respectively, are cut off by the switching circuits 8a through 8d, thus not being applied to an OR circuit 10. Accordingly, a detection indicating circuit 11 does not work. The detection indicating circuit 11 comprises a switching transistor Tr1 and a light emitting diode (LED). A recent electronic device includes a microcomputer circuit, thus being able to provide the repetitive frequencies f1, f2, f3 and f4 with ease.

In the case where the supply circuit of the DC supply voltage 112 V becomes out of order for some reason, and its output voltage is lower than the predetermined value, a voltage lower than the predetermined reference voltage is applied to the base of the transistor Tr in the control circuit 7d. Hence, the transistor Tr is rendered non-conductive (off), so that the first switching circuit 8d is turned on. Therefore, the signal generating circuit 9d applies an output signal of the repetitive frequency f4 to the OR circuit 10. The output signal of the OR circuit 10 is applied to the detection indicating circuit 11, so that the LED flickers with the repetitive frequency f4. Hence, it is detected that the supply circuit of the 112 V system is out of order.

The same thing may be said about the supply circuits of the DC supply voltages 12 V, 12 V, and 24 V. That is, in each of those cases, the device operates in the same manner, so that it can be detected from the repetitive frequency of the flickering phenomenon of the LED which one of the supply circuits is out of order.

Second Embodiment

Another example of the supply voltage abnormal condition indicating device, which constitutes a second embodiment of the invention, will be described with reference to FIG. 2. That is, the second embodiment is to indicate, in the case where the supply circuits of a plurality of power supply systems become abnormal, the supply circuits which are out of order. As is seen from comparison between FIGS. 1 and 2, the second embodiment may be obtained by adding a time sequential switching control circuit 12 and second switching circuits 13a, 13b, 13c and 13d which are turned on and off by the time sequential switching control circuit 12.

The device shown in FIG. 2 operates as follows: The time sequential switching control circuit 12 starts its operation when at least two power supply systems become abnormal. For instance, in the case where two power supply systems of 112 V and 24 V become abnormal, the circuit 12 outputs switching signals (high or low level signals) which are time-shifted sequentially from each other. The signals thus outputted are supplied to the second switching circuits 13d and 13c, respectively, which are connected in series to the output signal transmission paths of the signal generating circuits 9d and 9c which have the repetitive frequencies f4 and f3 corresponding to the two power supply systems which are abnormal, so that the signals passing through the first switching circuits 8d and 8c are on/off-controlled while being time-shifted. That is, the signal of the repetitive frequency f4 is kept on, for instance, for two seconds, and next the signal of the repetitive frequency f3 is kept on for two seconds. In response to this operation, the LED of the detection indicating circuit 11 flickers, so that the operator detects that the two power supply systems of 112 V and 24 V are abnormal.

In the case where more than two power supply systems become abnormal, similarly as in the above-described case, they can be detected with ease from the indication on the detection indicating circuit 11. The first switching circuits 8d and 8c, and the second switching circuit 13d and 13c are connected in series to the signal transmission paths. Hence, it goes without saying that the first and second switching circuits may be swapped in position.

Third Embodiment

Another example of the supply voltage abnormal condition indicating device, which constitutes a third embodiment of the invention, will be described with reference to FIG. 3. In the first and second embodiments shown in FIGS. 1 and 2, the different power supply systems utilize different repetitive frequencies; that is, each of the power supply systems is distinguished from the others by its own repetitive frequency; while, in the third embodiment, the different power supply systems are detected by using different voltages. For instance, in correspondence to the output voltage 12 V of the rectifier 3a, the output voltage 12 V of the rectifier 3b, the output voltage 24 V of the rectifier 3c, and the output voltage 112 V of the rectifier 3d, indicating voltage generating circuits 14a, 14b, 14c and 14d are caused to generate voltages 1 V, 2 V, 3 V and 4 V, respectively, which are indicated on a detection indicating circuit made up of a volt meter 15.

In the case where the supply circuit of the DC voltage 112 V becomes out of order for some reason, and its output voltage is lower than the predetermined value, a voltage lower than the predetermined reference voltage is applied to the base of the transistor Tr in the control circuit 7d, so that the transistor Tr is rendered non-conductive, and the first switching circuit 8d is turned on. As a result, the indicating voltage generating circuit 14d applies a signal voltage 4 V to the OR circuit 10, and the output of the OR circuit 10 is applied to the detection indicating circuit made up of the volt meter 15; that is, the volt meter 15 indicates "4 V". Hence, it is detected that the supply circuit of the 112 V power supply system is out of order. Also in the case where any one of the supply circuits of the DC supply voltages 12 V, 12 V and 24 V is out of order, the device operates in the same manner; hence it can be detected with ease which of the power supply systems is out of order.

Fourth Embodiment

Figure 2:
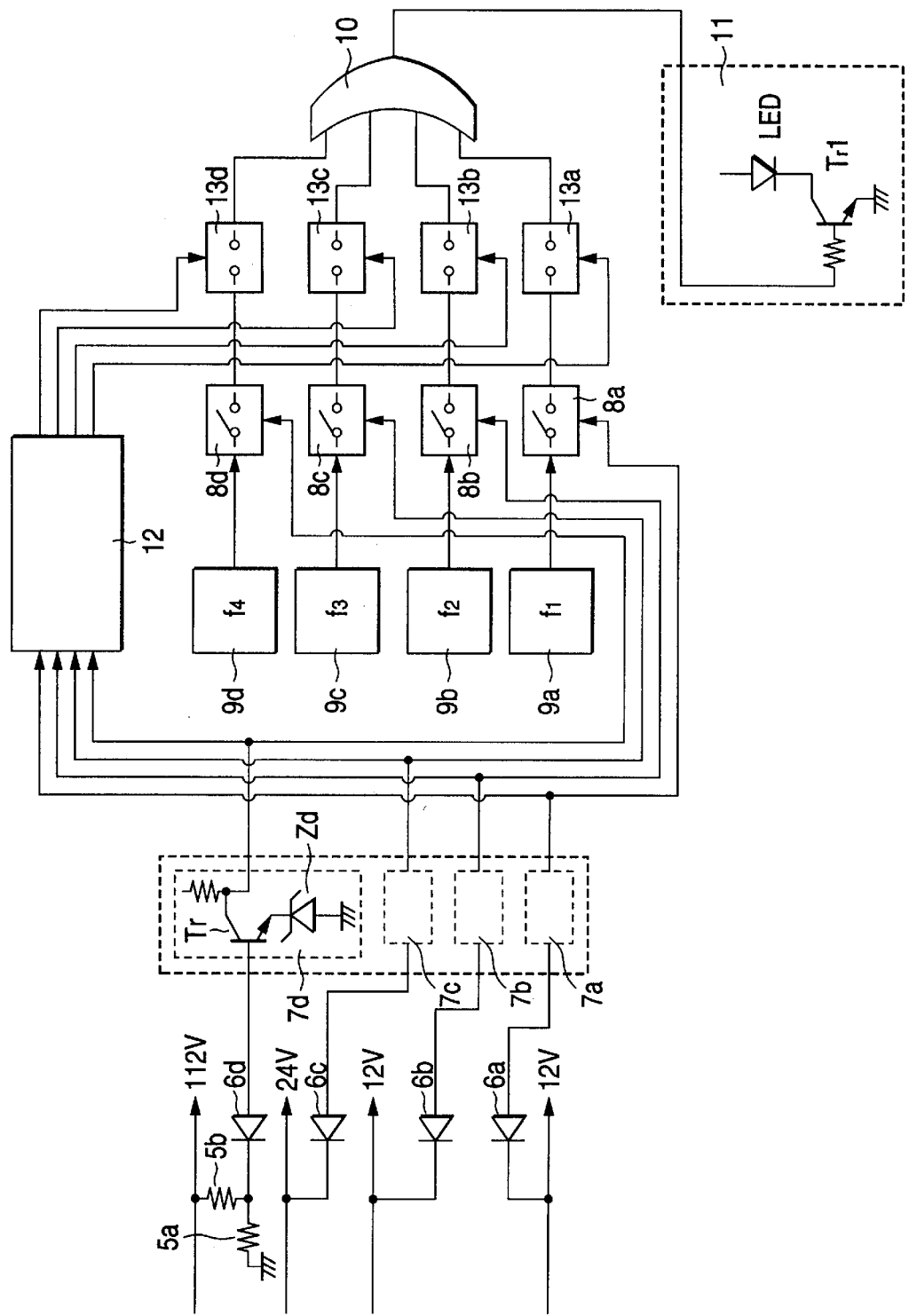
FIG. 2 is a circuit diagram, partly as a block diagram, showing another example of the supply voltage abnormal condition indicating device, which constitutes a second embodiment of the invention.
Figure 3:
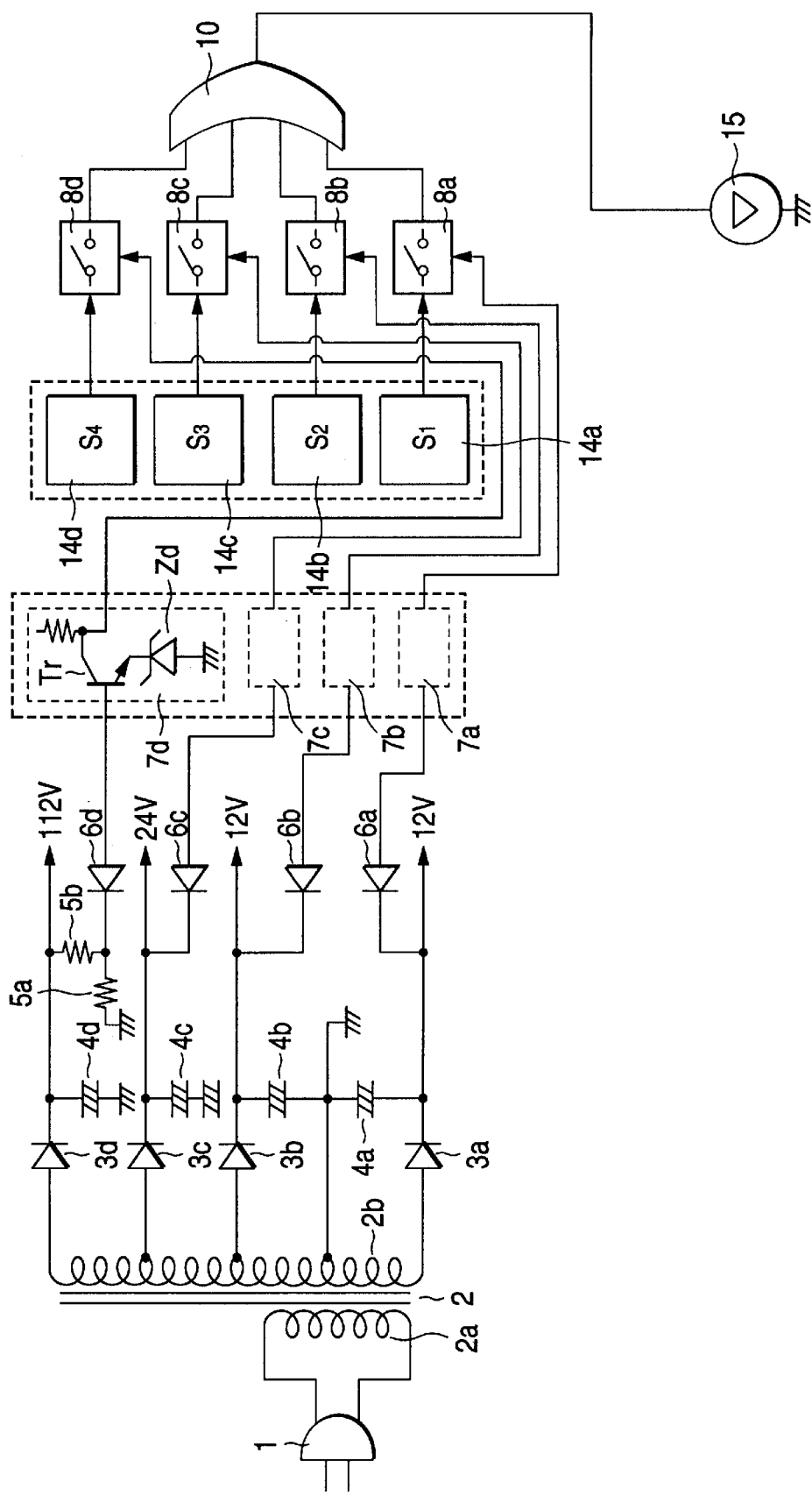
FIG. 3 is a circuit diagram, partly as a block diagram, showing another example of the supply voltage abnormal condition indicating device, which constitutes a third embodiment of the invention.
Figure 4:
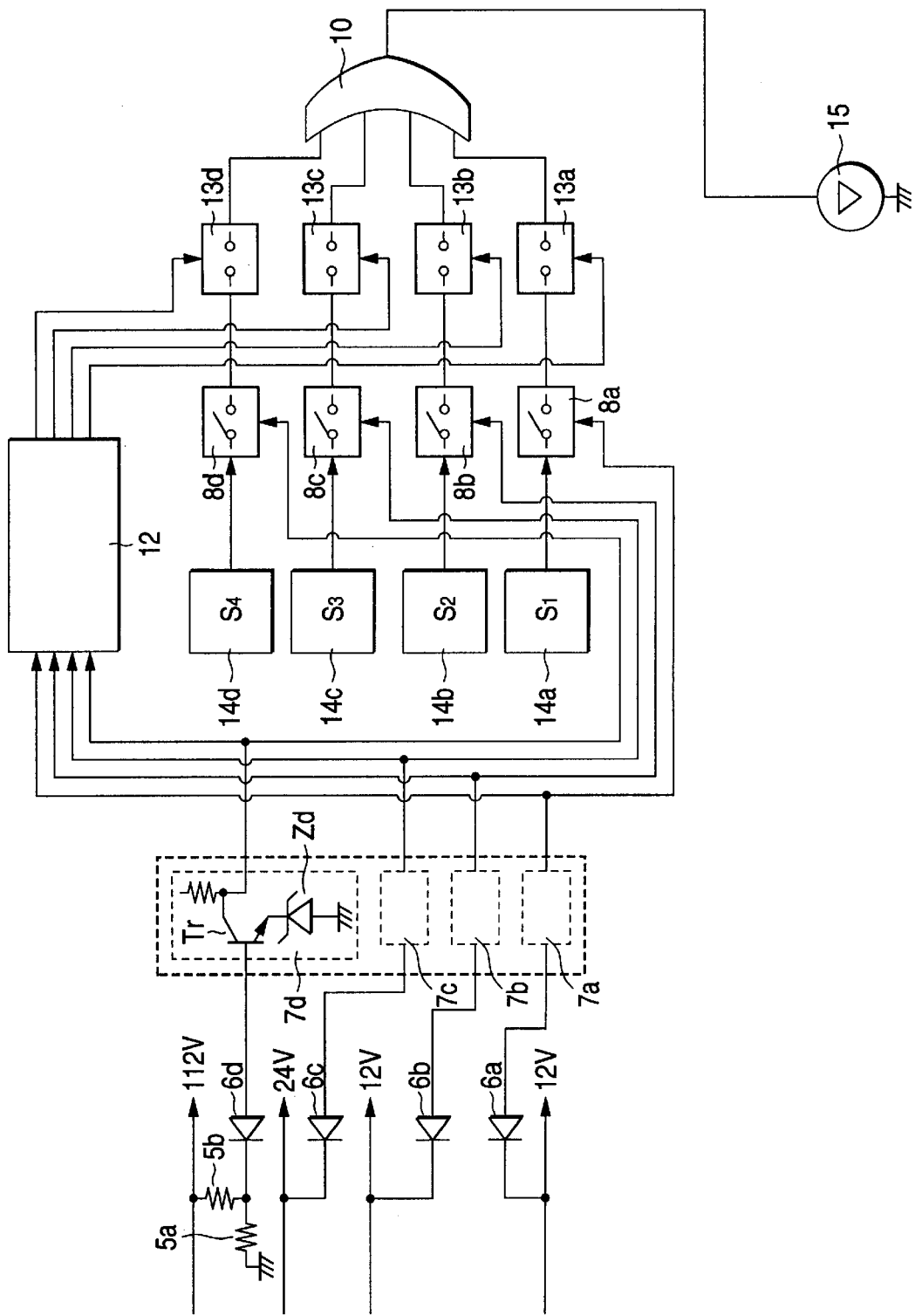
FIG. 4 is a circuit diagram, partly as a block diagram, showing another example of the supply voltage abnormal condition indicating device, which constitutes a fourth embodiment of the invention.

In FIG. 2, similarly as in the case of FIG. 3, instead of the signal generating circuits 9a, 9b, 9c and 9d, the indicating voltage generating circuits 14a, 14b, 14c and 14d may be connected. In this case, the device thus modified operates as follows: In FIG. 4, the time sequential switching control circuit 12 starts its operation when the supply circuits of at least two power supply systems become abnormal. For instance, in the case where the two power supply systems of 112 V and 24 V become abnormal, the circuit 12 outputs switching signals (high or low level signals) which are time-shifted sequentially from each other, and the switching signals are supplied to the second switching circuits 13d and 13c, respectively. The signals passing through the first switching circuits 8d and 8c; that is, the output signal voltages 4 V and 3 V of the indicating voltage generating circuits 14d and 14c which correspond to the two abnormal power supply systems, are on/off-controlled with time shift. For instance, the signal voltage 4 V of the indicating voltage generating circuit 14d is kept on for two seconds, and next the signal voltage 3 V of the indicating voltage generating circuit 14c is kept on for two seconds. In response to this operation, the volt meter 15 of the detection indicating circuit indicates "114 V" and "3 V". Therefore, the operator detects with ease that the two power supply systems of 112 V and 24 V are abnormal. Also in the case where more than two power supply systems become abnormal, the device operates in the same manner, so that it can be detected with each which of the power supply systems is abnormal.

As was described above, the supply voltage abnormal condition indicating device of the invention is designed as follows: The multi-system power supply circuit for providing power supplies different in system, has the signal generating circuits which correspond to the power supplies different in system respectively, and generates repetitive frequency signals corresponding to the number of power supply systems, is or the indicating voltage generating circuits which correspond to the power supplies different in system, and generates voltages corresponding to the number of power supply systems. When any one of the power supplies becomes abnormal, the repetitive signal supplied to the detection indicating circuit from the repetitive frequency signal generating circuit corresponding to that power supply is turned on and off, or the indicating voltage generating circuit applies the indicating voltage to the detection indicating circuit, so that it can be detected with ease which of the power supply systems is abnormal.

Also in the case where the supply circuits of a plurality of power supply systems become abnormal, the repetitive frequencies which are indicated with a predetermined time interval, or the magnitudes of the voltages which are indicated are utilized to detect which systems are abnormal. Hence, the power supply circuit can be repaired or inspected with high efficiency.

What is claimed is:

1. A supply voltage abnormal condition indicating device comprising:

a multi-system power supply circuit including a plurality of power supplies each of which normally supplies an output voltage having a substantially constant nominal value;

signal generating circuits which correspond to each of the power supplies of said power supply circuit, and generate output signals of repetitive frequencies corresponding to each of the power supplies of said power supply circuit;

a detection indicating circuit to which said output signals of said signal generating circuits are selectively supplied; and control circuits means connected between each of said power supplies of said power supply circuit and said detection indicating circuit, respectively, so that, when a certain power supply of said power supply circuit becomes abnormal in output voltage and the output voltage deviates from its nominal value, a signal of a repetitive frequency corresponding to an associated power supply is supplied to said detection indicating circuit from said signal generating circuit, wherein said detection indicating circuit is energized when any one of said output voltages deviates from its nominal value to indicate that an associated power supply is abnormal.

2. The supply voltage abnormal condition indicating device as claimed in claim 1, wherein said control circuit means includes a number of control circuits equal to the number of the power supplies of said power supply circuit, and each of said control circuits includes a reference voltage circuit and a comparison circuit connected to one of the power supplies of said power supply circuit.

3. The supply voltage abnormal condition indicating device as claimed in claim 1, wherein said detection indicating circuit includes a light emitting diode and a switching circuit thereof.

* * * * *